(12) United States Patent
Jung et al.

(10) Patent No.: US 6,330,199 B2
(45) Date of Patent: Dec. 11, 2001

(54) SEMICONDUCTOR MEMORY DEVICE AND REDUNDANCY CIRCUIT, AND METHOD OF INCREASING REDUNDANCY EFFICIENCY

(75) Inventors: Hyun Taek Jung; Gyu Hong Kim, both of Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/741,162

(22) Filed: Dec. 21, 2000

(30) Foreign Application Priority Data

Mar. 17, 2000 (KR) .................................................. 00-13711

(51) Int. Cl.[7] ...................................................... G11C 7/00
(52) U.S. Cl. ......................................... 365/200; 365/225.7
(58) Field of Search ..................................... 365/200, 201, 365/185.09, 225.7, 230.06, 230.03

(56) References Cited

U.S. PATENT DOCUMENTS

| 5,325,334 | 6/1994 | Roh et al. ............................. 365/201 |
| 5,999,463 | * 12/1999 | Park et al. ............................. 365/200 |
| 6,118,712 | * 9/2000 | Park et al. ............................. 365/200 |

* cited by examiner

*Primary Examiner*—Tan T. Nguyen
(74) *Attorney, Agent, or Firm*—Volentine Francos, PLLC (57) ABSTRACT

In a semiconductor memory device having redundancy capability, a control signal generating circuit is included respectively for each of a predetermined number of redundant column select signal lines, to generate a predetermined number of block control signals by dividing a plurality of memory cell array blocks into a predetermined number of groups. A predetermined number of defective enable signal generating circuits are included for each of the redundant column select signal lines, to generate a predetermined number of redundant enable signals when defective addresses are input. The redundant column select signal lines are established for defective addresses based on the block control signals. A selection circuit is included respectively for each of the redundant column select signal lines to generate a select signal for selecting a redundant column select signal line corresponding to each of a predetermined number of redundant enable signals, in response to the block control signals. The efficiency of redundancy is thus improved by performing a redundancy operation by dividing a plurality of memory cell arrays into a predetermined number of groups for each of redundant column select signals.

13 Claims, 10 Drawing Sheets

SEMICONDUCTOR MEMORY DEVICE AND REDUNDANCY CIRCUIT, AND METHOD OF INCREASING REDUNDANCY EFFICIENCY

The present application claims priority under 35 U.S.C. 119 to Korean Application No. 2000-13711 filed on Mar. 17, 2000, which is hereby incorporated by reference in its entirety for all purposes.

BACKGROUND OF THE INVENTION

1. Field of the Invention

The present invention relates to a semiconductor memory device, and more particularly, to a semiconductor memory device and a redundancy circuit, and a method thereof which can increase the redundancy efficiency during performing of a column redundancy operation.

2. Description of the Related Art

A conventional semiconductor memory device replaces a column select signal line connected to a defective partial block of a memory with a redundant column select signal line connected to a redundant partial block of each of memory cell array blocks, when partial blocks of a plurality of memory cell array blocks are defective. Here, a partial block is a block including memory cells connected to one column select signal line. However, in this case a partial block of not only a defective block, but also partial blocks of other memory cell array blocks connected to the same column select signal line as the defective partial block, are replaced with a redundant partial block.

For example, in a case that the number of redundant partial blocks of each of memory cell array blocks is one and there is a defect in one partial block of one memory cell array block among a plurality of memory cell array blocks, the conventional semiconductor memory device replaces a column select signal line connected to a defective partial block with a redundant column select signal line connected to a redundant partial block. Then, partial blocks of other memory cell array blocks connected to the defective column select signal line are also replaced with a redundant partial block.

However, if there are defects in other partial blocks of other memory cell array blocks, this semiconductor memory device cannot be repaired. That is, there is a problem that the conventional semiconductor memory device can not be repaired when the number of defective column select signal lines that occur in all the memory cell array blocks exceeds the number of redundant column select signal lines. This is because a redundancy circuit of the conventional semiconductor memory device is configured so that a column select signal line connected to partial blocks located in the identical position among a plurality of memory cell array blocks is replaced with a redundant column select signal line. This problem may occur in a semiconductor memory device of a stack bank structure. Therefore, a conventional semiconductor memory device has a problem that redundancy efficiency is poor with respect to performing column redundancy.

A redundancy circuit of a conventional semiconductor memory device directed to solving the above problem is disclosed in U.S. Pat. No. 5,325,334, entitled "Column Redundancy Circuit of a Semiconductor Memory Device". This circuit is configured to select a defective block by a block selection control circuit during performing of a column redundancy operation, and to generate a redundant enable signal by programming a column address of a defective block.

The above noted redundancy circuit of the conventional semiconductor memory device can increase the redundancy efficiency by performing a redundancy operation selectively by use of a block select signal, so as to select defective memory cell array blocks. However, the above noted redundancy circuit of the conventional semiconductor memory device has a problem in that the redundancy efficiency increases for regular defects, but decreases for irregular defects.

Figure 1:
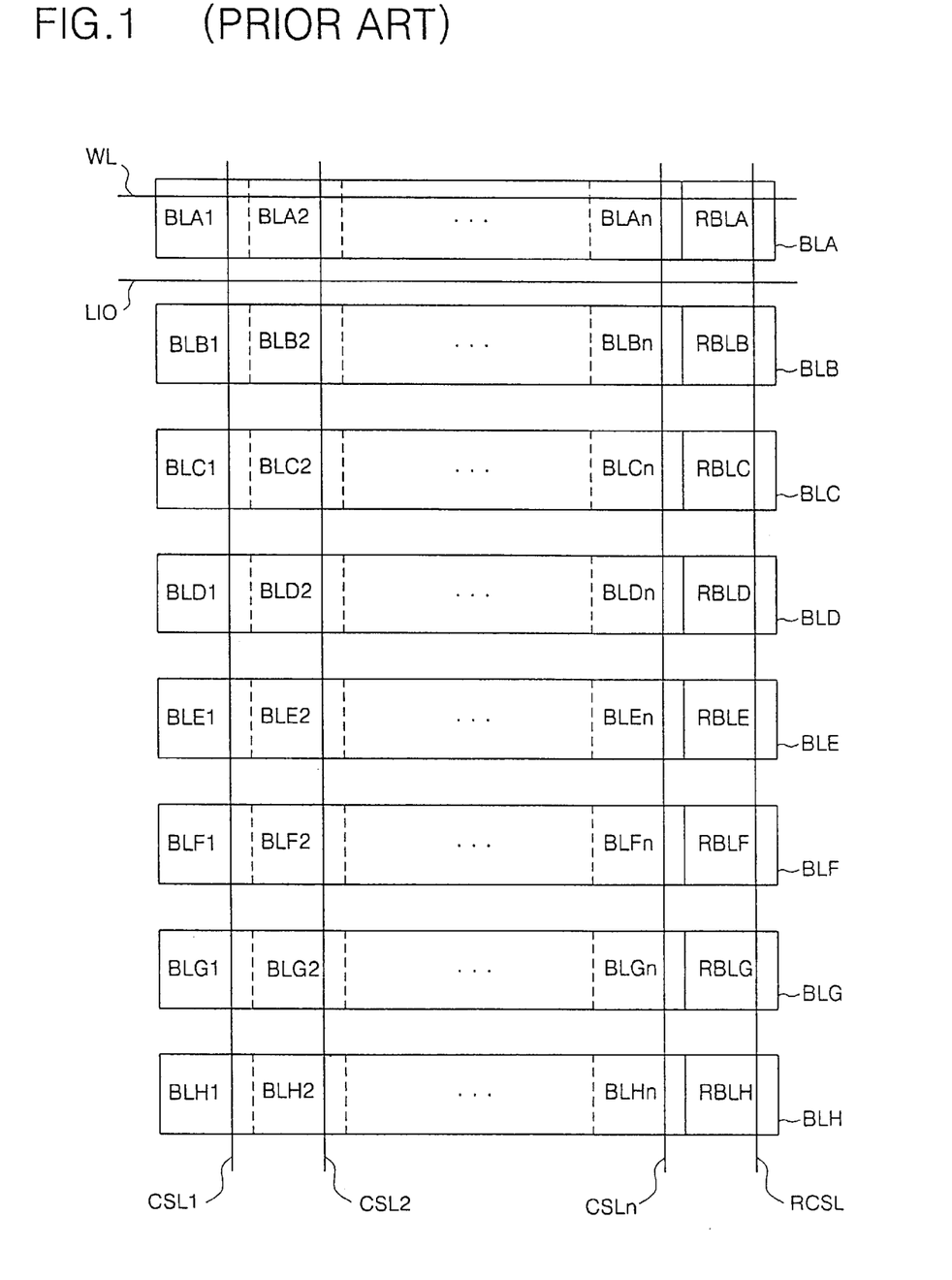
FIG. 1 is a configuration of a memory cell array of a conventional semiconductor memory device.

A redundancy method of a conventional semiconductor memory device will now be described as follows with reference to the accompanying drawings. FIG. 1 is a configuration of a memory cell array of a conventional semiconductor memory device, including eight memory cell array blocks BLA, BLB, BLC, BLD, BLE, BLF, BLG and BLH, and a word line WL is arranged in a horizontal direction in each of the eight memory cell array blocks. A local data input/output line LIO is arranged between neighboring memory cell array blocks, and column select signal lines CSL1, CSL2, . . . and CSLn and a redundant column select signal line RCSL are arranged in a vertical direction.

In FIG. 1, partial blocks indicated by a dotted line are partial blocks of each of the memory cell array blocks and are connected to column select signal lines CSL1, CSL2, . . . and CSLn. Partial blocks indicated by a solid line are redundant partial blocks and are connected to the redundant column select signal line RCSL. Each of memory cell array blocks BLA, BLB, BLC, BLD, BLE, BLF, BLG and BLH respectively comprises n memory cell partial blocks and redundant partial blocks BLA1, . . . , BLAn, RBLA; BLB1, . . . , BLBn, RBLB; . . . and BLH1, . . . , BLHn, RBLH. A redundancy method of the prior semiconductor memory device will be described as follows using FIG. 1.

If a memory cell of a partial block BLA2 of a memory cell array block BLA connected to a column select signal line CSL2 is defective, a column select signal line CSL2 is replaced with a redundant column select signal line RCSL when a corresponding column address is inputted, without regard to whichever block is selected among memory cell array blocks BLA, BLB, BLC, BLD, BLE, BLF, BLG and BLH. However, in a case that a partial block BLA1 of a memory cell array block BLA and a partial block BLB2 of a memory cell array block BLB are defective at the same time, only one line of a column select signal line CSL1 or a column select signal line CSL2 can be replaced with a redundant column select signal line RCSL. That is, partial blocks BLA1, BLB1, . . . and BLH1 connected to a column select signal line CSL1 are replaced with redundant partial blocks RBLA, RBLB, . . . and RBLH respectively, or partial blocks BLA2, BLB2, . . . and BLH2 connected to a column select signal line CSL2 are replaced with redundant partial blocks RBLA, RBLB, . . . and RBLH respectively.

Therefore, in a case that there is only one redundant column select signal line RCSL as shown in FIG. 1, one column select signal line of all the memory cell array blocks is replaced with a redundant column select signal line, and other column select signal lines can not be replaced with a redundant column select signal line.

Figure 2:
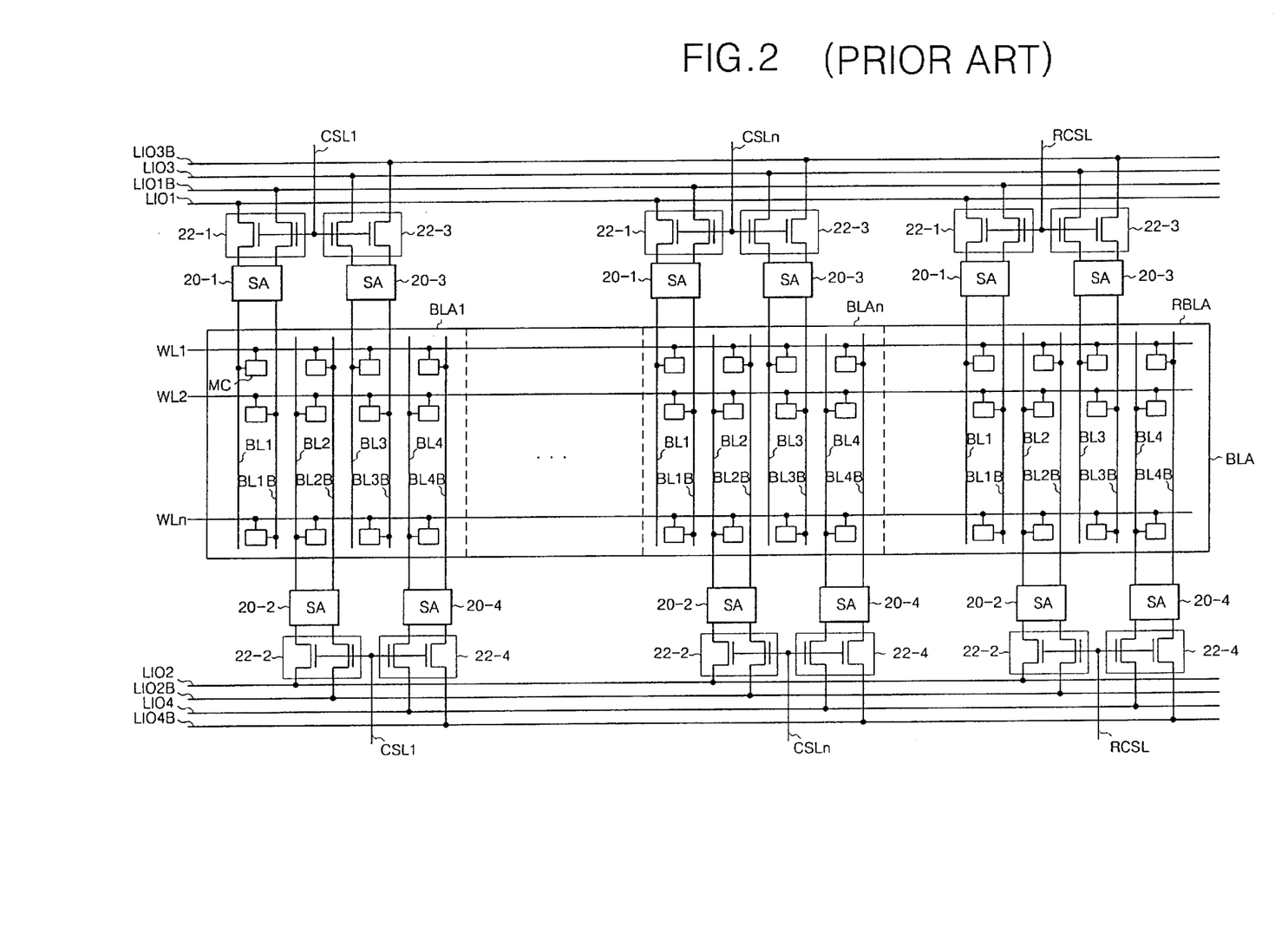
FIG. 2 is a configuration of a memory cell array block BLA and a peripheral circuit of FIG. 1.

FIG. 2 is a configuration of an embodiment of a memory cell array block BLA and a peripheral circuit thereof shown in FIG. 1, wherein a partial block BLA1 comprises memory cells MC connected between four bit line pairs BL1, BL1B; BL2, BL2B; BL3, BL3B and BL4, BL4B and word lines WL1, . . . and WLn. The peripheral circuit of the partial block BLA1 comprises sense amplifiers 20-1, 20-2, 20-3 and 20-4 for amplifying input/output data that are connected to four bit line pairs BL1, BL1B; BL2, BL2B; BL3, BL3B and BL4, BL4B respectively, and comprises data input/output gates 22-1, 22-2, 22-3 and 22-4 which are connected between sense amplifiers 20-1, 20-2, 20-3 and 20-4 and local data input/output line pairs LIO1, LIO1B; LIO2, LIO2B; LIO3, LIO3B and LIO4, LIO4B and which are for transmitting data in response to a signal applied to a column select signal line CSL1. The configuration of the other partial blocks and peripheral circuits are the same as the configuration of partial block BLA1 and the corresponding peripheral circuit.

A data input/output operation in FIG. 2 will be described as follows. If a memory cell array BLA is selected and a signal applied to a column select signal line CSL1 is activated, data input/output gates 22-1, 22-2, 22-3 and 22-4 of partial block BLA1 are turned on and data is transmitted between bit line pairs BL1, BL1 B; BL2, BL2B; BL3, BL3B and BL4, BL4B of the partial block BLA1 and local data input/output line pairs LIO1, LIO1B; LIO2, LIO2B; LIO3, LIO3B and LIO4, LIO4B.

A redundancy method of the conventional semiconductor memory device will be described as follows using FIG. 1 and FIG. 2. In a case that a memory cell in a partial block BLA1 of a memory cell array block BLA is defective, a column select signal line CSL1 is replaced with a redundant column select signal line RCSL. Accordingly, a redundancy circuit of the conventional semiconductor memory device replaces the column select signal line CSL1 with the redundant column select signal line RCSL, even if memory cell array blocks other than the memory cell array block BLA are not selected.

That is, as known from the configuration of FIG. 2, there is a problem in that the conventional semiconductor memory device can not be repaired in a case wherein the number of column select signal lines which are to be replaced because of a defect in different partial blocks of different memory cell array blocks, exceeds the number of redundant column select signal lines of a redundant partial block.

Figure 3:
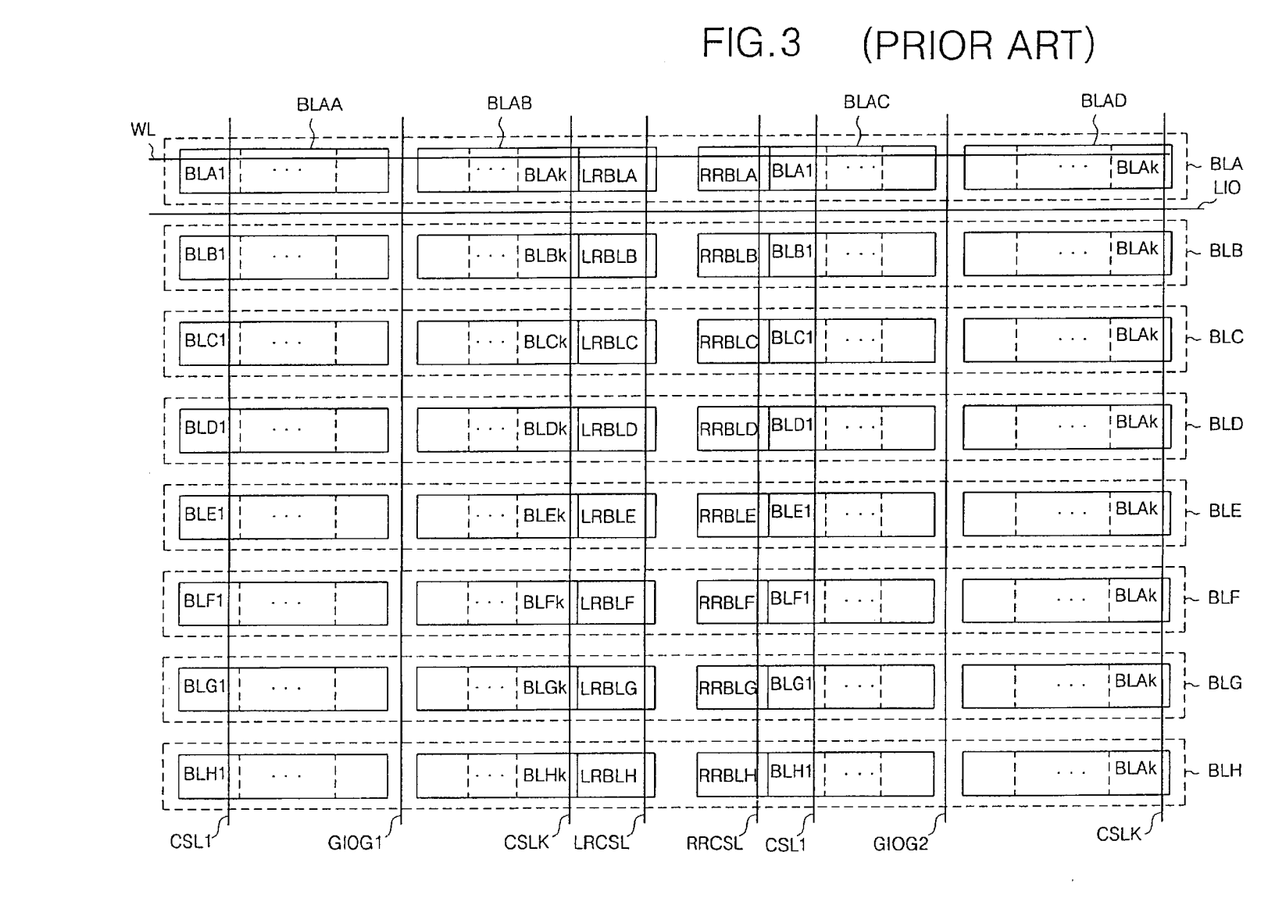
FIG. 3 is a configuration of a semiconductor memory device of a conventional stack bank structure.

FIG. 3 is a configuration of a semiconductor memory device of the conventional stack bank structure, including eight memory cell array blocks BLA, BLB, BLC, BLD, BLE, BLF, BLG and BLH. Each of the memory cell array blocks respectively comprises four partial blocks BLAA, BLAB, BLAC, BLAD; BLBA, BLBB, BLBC, BLBD; . . . and BLHA, BLHB, BLHC, BLHD. Each of two left and right neighboring partial blocks comprise k partial blocks and a redundant partial block. That is, partial blocks BLAA and BLAB on the left comprise k partial blocks BLA1, . . . and BLAk and a redundant partial block LRBLA, and partial blocks BLAC and BLAD on the right comprise a redundant partial block RRBLA and k partial blocks BLA1, . . . and BLAk.

Also in FIG. 3, word lines WL and local data input/output lines LIO are arranged horizontally and global data input/output line groups GIOG1 and GIOG2 are arranged vertically. A local data input/output line LIO is constituted as being separated within a unit of two neighboring partial blocks of each of the blocks, and each of global data input/output line groups GIOG1 and GIOG2 are arranged between two neighboring partial blocks on the left and right. Column select signals CSL1, . . . and CSLk transfer data between a corresponding partial block of two neighboring partial blocks on the left and right and corresponding global data input/output line groups GIOG1 and GIOG2.

In the configuration of FIG. 3, in a redundancy method in a case wherein memory cells of two partial blocks on the left are defective, one column select signal line connected to the defective memory cell is replaced with a redundant column select signal LRCSL of the left redundant partial blocks LRBLA, LRBLB, LRBLC, LRBLD, LRBLE, LRBLF, LRBLG and LRBLH. However, the other defective column select signal line can not be repaired. That is, a semiconductor memory device shown in FIG. 3 can be repaired only when one column select signal line is defective, since there is one redundant column select signal line on the left. The semiconductor memory device can not be repaired in a case wherein more than two column select signal lines are defective.

Similarly, in a redundancy method in a case wherein memory cells of two partial blocks on the right are defective, one column select signal line connected to the defective memory cell is replaced with a redundant column select signal RRCSL of the right redundant partial blocks RRBLA, RRBLB, RRBLC, RRBLD, RRBLE, RRBLF, RRBLG and RRBLH. Also in this case similarly to the redundancy operation on the left, the semiconductor memory device can be repaired only when one column select signal line is defective, since there is one redundant column select signal line on the right. That is, the semiconductor memory device can not be repaired in a case that the number of defective column select signal lines that occur in different partial blocks of different memory cell array blocks exceeds the number of redundant column select signal lines of a redundant partial block.

Figure 4:
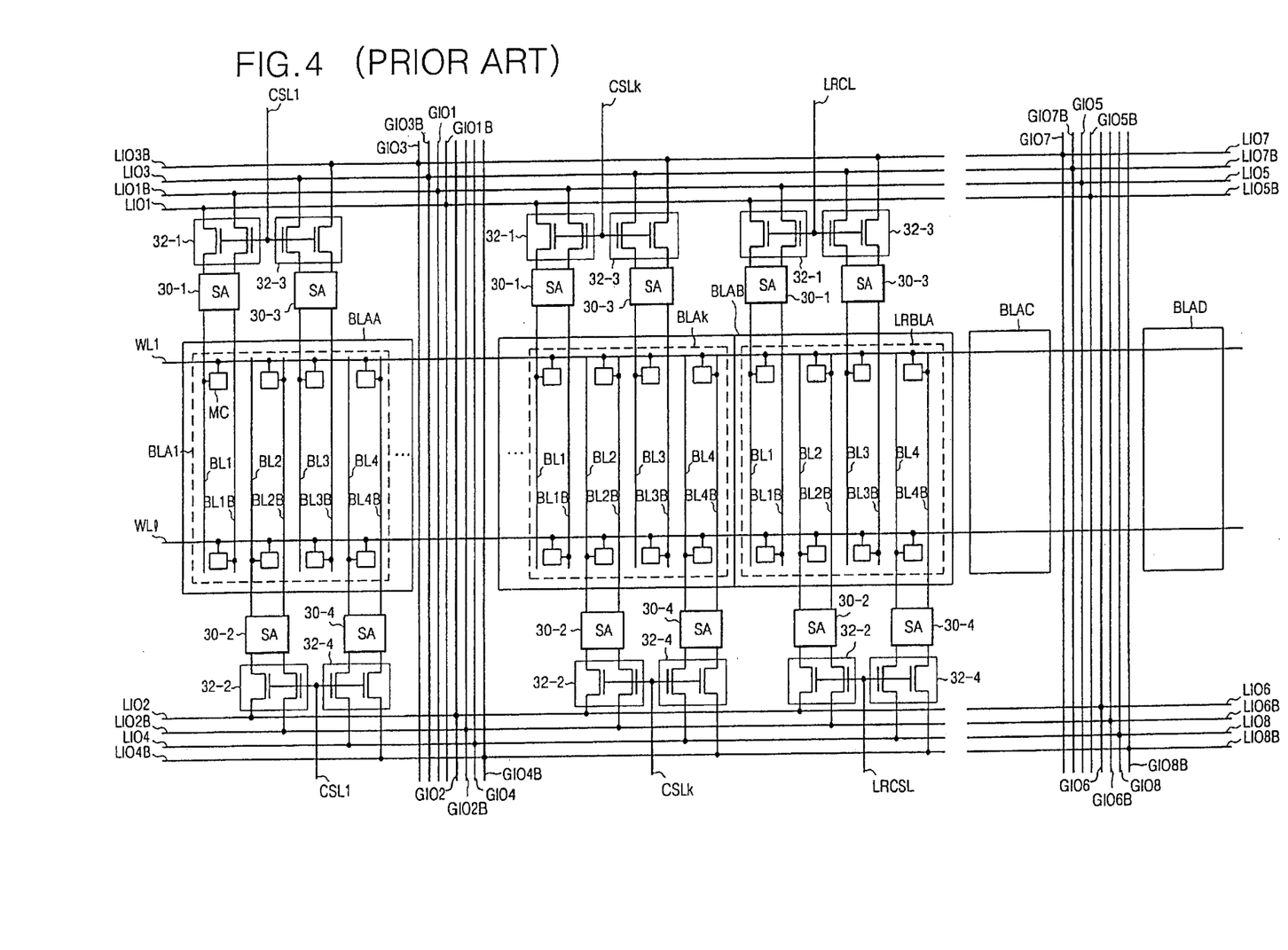
FIG. 4 is a circuit diagram showing a configuration of a memory cell array block BLA and a peripheral circuit of FIG. 3.

FIG. 4 is a circuit diagram showing the configuration of an embodiment of a memory cell array block BLA and a peripheral circuit thereof for the block diagram shown in FIG. 3. The configuration of a partial block BLA1 of a partial block BLAA of a memory cell array block BLA is the same as the configuration of the partial block BLA1 shown in FIG. 2. A peripheral circuit of a partial block BLA1 comprises sense amplifiers 30-1, 30-2, 30-3 and 30-4 connected between bit line pairs BL1, BL1B; BL2, BL2B; BL3, BL3B and BL4, BL4B, and comprises data input/output gates 32-1, 32-2, 32-3 and 32-4 for controlling data transmission between local data input/output line pairs LIO1, LIO1B; LIO2, LIO2B; LIO3, LIO3B and LIO4, LIO4B and sense amplifiers 30-1, 30-2, 30-3 and 30-4. The configuration of the other partial blocks and peripheral circuits are the same as the configuration of the partial block BLA1. The symbols and numbers of the peripheral circuit are marked identically in the drawing.

In a case that the partial block BLA1 of a memory cell array block BLA in FIG. 4 is defective, a redundancy method of the conventional semiconductor memory device replaces a column select signal line CSL1 with a redundant column select signal line LRCSL, when a column address for selecting the column select signal line CSL1 is applied. However, a redundancy circuit of the conventional semiconductor memory device replaces the column select signal line CSL1 with the redundant column select signal line LRCSL, and also replaces other memory cell array blocks BLB, BLC, BLD, BLE, BLF, BLG and BLH other than the memory cell array block BLA selected.

Therefore, there is a problem that the semiconductor memory device shown in FIG. 3 replaces only one column select signal line of column select signal lines CSL1 and CSLk connected to partial blocks BLA1 and BLBk with a redundant column select signal line LRCSL, but can not replace another column select signal line with the redundant column select signal line LRCSL if a partial block BLA1 of a memory cell array block BLA and a partial block BLBk of a memory cell array block BLB are defective. Accordingly, the redundancy method of the conventional semiconductor memory device has a problem in that redundancy efficiency is poor.

SUMMARY OF THE INVENTION

The present invention is therefore directed to a semiconductor memory device and redundancy circuit, and method of increasing redundancy efficiency, which substantially overcomes one or more of the problems due to the limitations and disadvantages of the related art.

An object of the present invention is to provide a semiconductor memory device which can increase redundancy efficiency operation, during performing of a redundancy operation.

Another object of the present invention is to provide a redundancy circuit of a semiconductor memory device that can increase redundancy efficiency.

A further object of the present invention is to provide a redundancy method for a semiconductor memory device that can increase redundancy efficiency.

According to one aspect of the present invention for accomplishing the above objects, a semiconductor memory device of the present invention comprises a plurality of memory cell array blocks including a plurality of partial blocks and a predetermined number of redundant partial blocks respectively and including a plurality of column select signal lines connected to the plurality of partial blocks and a predetermined number of redundant column select signal lines connected to the predetermined number of redundant partial blocks; control signal generators, respectively included for each of the predetermined number of redundant column select signal lines, that generate a predetermined number of block control signals by dividing the plurality of memory cell array blocks into a predetermined number of groups; a predetermined number of defective redundant enable signal generators included for each of the predetermined number of redundant column select signal lines, that generate a predetermined number of redundant enable signals when defective addresses corresponding to each of the predetermined number of block control signals are input; and selectors, respectively included for each of the predetermined number of redundant column select signal lines, that generate each of the predetermined number of redundant enable signals as a select signal that selects the corresponding redundant column select signal line in response to each of the predetermined number of block control signals.

According to another aspect of the present invention to accomplish the above noted objects, a redundancy circuit of a semiconductor memory device of the present invention that has a plurality of memory cell array blocks including a plurality of partial blocks and at least more than one redundant partial blocks respectively, comprises control signal generators, respectively included for each of the at least more than one redundant partial blocks, that generate a predetermined number of block control signals by dividing the plurality of memory cell array blocks into a predetermined number of groups; a predetermined number of defective redundant enable signal generators included for each of the at least more than one redundant partial blocks, that generate a predetermined number of redundant enable signals when defective addresses corresponding to each of the predetermined number of block control signals are input; and selectors, respectively included for each of the at least more than one redundant partial blocks, that generate each of the predetermined number of redundant enable signals into a select signal that selects the corresponding redundant partial block in response to each of the predetermined number of block control signals.

According to a further aspect of the present invention, to accomplish the above objects a redundancy method of a semiconductor memory device is provided, wherein the semiconductor memory device includes a plurality of partial blocks and at least more than one redundant partial blocks respectively as a plurality of memory cell array blocks, a plurality of column select signal lines connected to the plurality of partial blocks, and at least more than one redundant column select signal lines connected to the at least more than one redundant partial blocks. The redundancy method includes generating a predetermined number of block control signals for each of the at least more than one redundant column select signal lines, by dividing the plurality of memory cell array blocks into a predetermined number of groups; generating a predetermined number of redundant enable signals for each of the at least more than one redundant column select signal lines, when defective addresses corresponding to each of the predetermined number of block control signals are input; and generating each of the predetermined number of redundant enable signals into a select signal that selects a corresponding redundant column select signal line in response to each of the predetermined number of block control signals for each of the at least more than one redundant column select signal lines.

A semiconductor memory device and a redundancy method thereof of the present invention increases redundancy efficiency by performing a redundancy operation by dividing a plurality of memory cell array blocks into a predetermined number of groups, according to the form of defects. Therefore, the yield of a semiconductor memory device in accordance with the present invention is improved, because a defect which cannot be repaired in a conventional semiconductor memory device can be repaired in the semiconductor device of the invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF PREFERRED EMBODIMENTS

A semiconductor memory device and a redundancy circuit, and a method of increasing redundancy efficiency will be described as follows with reference to the accompanying drawings.

Figure 5:
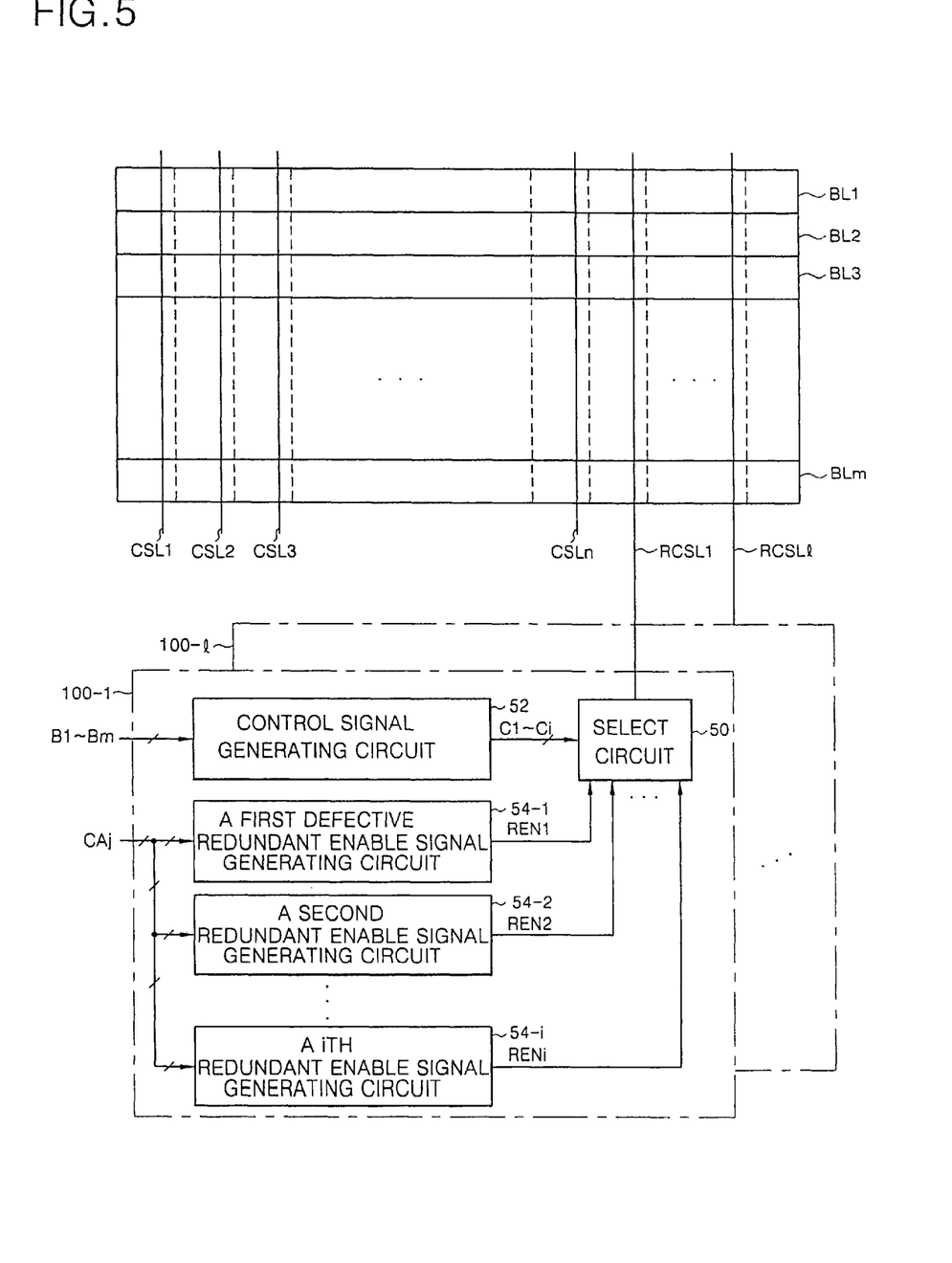
FIG. 5 is a block diagram of a configuration of a redundancy circuit of a semiconductor memory device of an embodiment of the present invention.

FIG. 5 is a block diagram showing the configuration of a redundancy circuit of a semiconductor memory device of the present invention, and includes a memory cell array bank having m memory cell array blocks BL1, BL2, BL3, . . . and BLm, and l redundancy circuits 100-1, . . . and 100-l, each redundancy circuit including a selection circuit 50, a control signal generating circuit 52, and i defective redundant enable signal generating circuits 54-1, 54-2, . . . and 54-i.

The block diagram shown in FIG. 5 shows a configuration capable of replacing l defective column select signal lines of n column select signal lines CSL1, CSL2, CSL3, . . . and CSLn of each of m memory cell array blocks BL1, BL2, BL3, . . . and BLm with l redundant column select signal lines RCSL1, . . . and RCSLl. That is, each of l redundancy circuits 100-1, . . . and 100-l are connected to each of l redundant column select signal lines.

The function of each of blocks shown in FIG. 5 will be described as follows. The memory cell array bank includes m memory cell array blocks BL1, BL2, BL3, . . . and BLm; n column select signal lines CSL1, CSL2, CSL3, . . . and CSLn connected to partial blocks; and l redundant column select signal lines RCSL1, . . . and RCSLl.

Selection circuit 50 of the redundancy circuit outputs each of i redundant enable signals REN1, REN2, . . . and RENi in response to each of i block control signals output from control signal generating circuit 52. Control signal generating circuit 52 generates i block control signals C1, . . . and Ci responsive to m block select signals B1, . . . and Bm. At this time, the generated block control signals C1, . . . and Ci are signals generated by dividing block select signals B1, . . . and Bm for selecting each of m memory cell array blocks BL1, BL2, BL3, . . . and BLm, into i groups.

Each of defective redundant enable signal generating circuits 54-1, 54-2, . . . and 54-i generate i redundant enable signals REN1, REN2, . . . and RENi when a corresponding column address is established as a defective address of memory cell array blocks of i groups, responsive to input of a column address CAj of j bits. If redundant enable signals REN1, REN2, . . . and RENi are generated, a column decoder (not shown) is disabled. Therefore, a column select signal line connected to a defective memory cell is replaced with a redundant column select signal line.

The l redundancy circuits 100-1, . . . and 100-l shown in FIG. 5 can be configured identically, but may also be configured non-identically. That is, the l redundancy circuits 100-1, . . . and 100-l can be configured differently because column select signal lines which the l redundancy circuits 100-1, . . . and 100-l cope with can be different.

Figure 6:
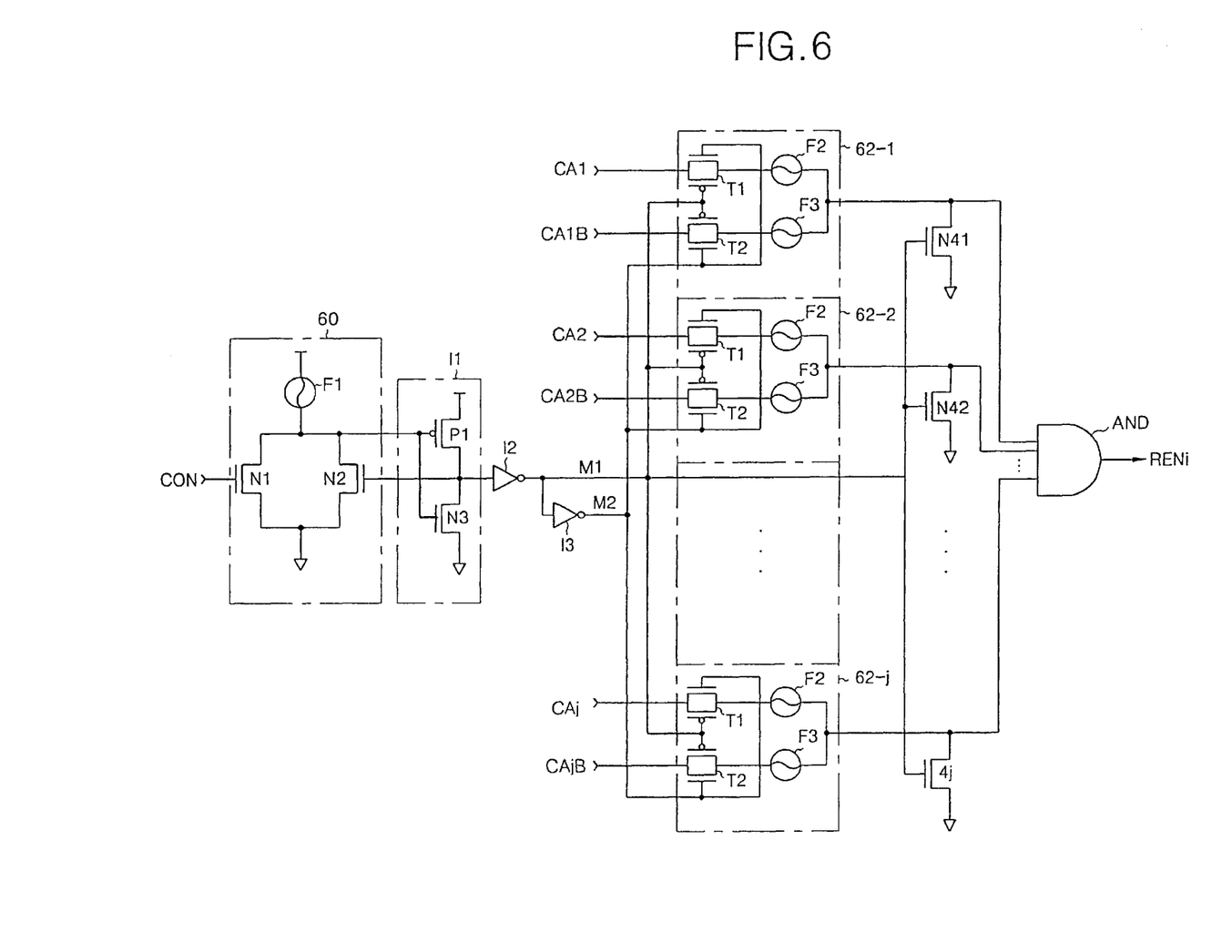
FIG. 6 is a circuit diagram of a defective redundant enable signal generating circuit of FIG. 5.

FIG. 6 is a circuit diagram of each of the defective redundant enable signal generating circuits shown in FIG. 5, and includes a redundant control circuit 60 having NMOS transistors N1 and N2 and a fuse F1, an inverter I1 comprising a PMOS transistor P1 and an NMOS transistor N3, inverters I2 and I3, defective address setting circuits 62-1, 62-2, . . . and 62-j comprising CMOS transmission gates T1 and T2 and fuses F2 and F3, NMOS transistors N41, N42, . . . and N4j, and an AND gate AND.

The function of each of circuits shown in FIG. 6 will be described as follows. If a fuse F1 of a redundant control circuit 60 is not cut, the redundant operation is not performed, and if the fuse F1 is cut, the redundant operation is performed. If the fuse F1 is not cut, the redundant control circuit 60 generates a "high" level signal. Inverters I1 and I2 delay the "high" level signal and generate a "high" level signal M1. Then, NMOS transistors N41, N42, . . . and N4j are turned on and generate a "low" level signal, to reset an output signal of defective address setting circuits 62-1, 62-2, . . . and 62-j. An AND gate AND, responsive to the "low" level signals input thereto, generates a "low" level redundancy enable signal RENi. That is, in this case, the redundant operation is not performed.

If the fuse F1 is cut and a control signal CON goes to "high" level, the redundant control circuit 60 generates a "low" level signal. Inverters I1 and I2 delay the "low" level signal and generate a "low" level signal M1. Then, NMOS transistors N41, N42, . . . and N4j are turned off. An inverter I3 inverts the "low" level signal M1 and generates a "high" level signal M2. CMOS transmission gates T1 and T2 of defective address setting circuits 62-1, 62-2, . . . and 62-j are turned on in response to the "low" level signal M1 and the "high" level signal M2 and transmit column addresses CA1, CA1B and CA2, CA2B, . . . and CAj, CajB respectively. At this time, it is possible to set a defective address by cutting one fuse of fuses F2 and F3 of defective address setting circuits 62-1, 62-2, . . . and 62-j. If a defective column address CA1, CA2 . . . CAj is 00 . . . 1, it is only necessary to cut fuse F2 of each of defective address setting circuits 62-1, 62-2, . . . and to cut the fuse F3 of defective address setting circuit 62-j. Then, all output signals of defective address setting circuits 62-1, 62-2, . . . and 62-j go to a "high" level upon receipt of the defective address. The AND gate AND generates a "high" level redundant enable signal RENi by ANDing "high" level output signals. If the "high" level redundant enable signal RENi is generated, the operation of a column address decoder (not shown) is disabled.

Figure 7:
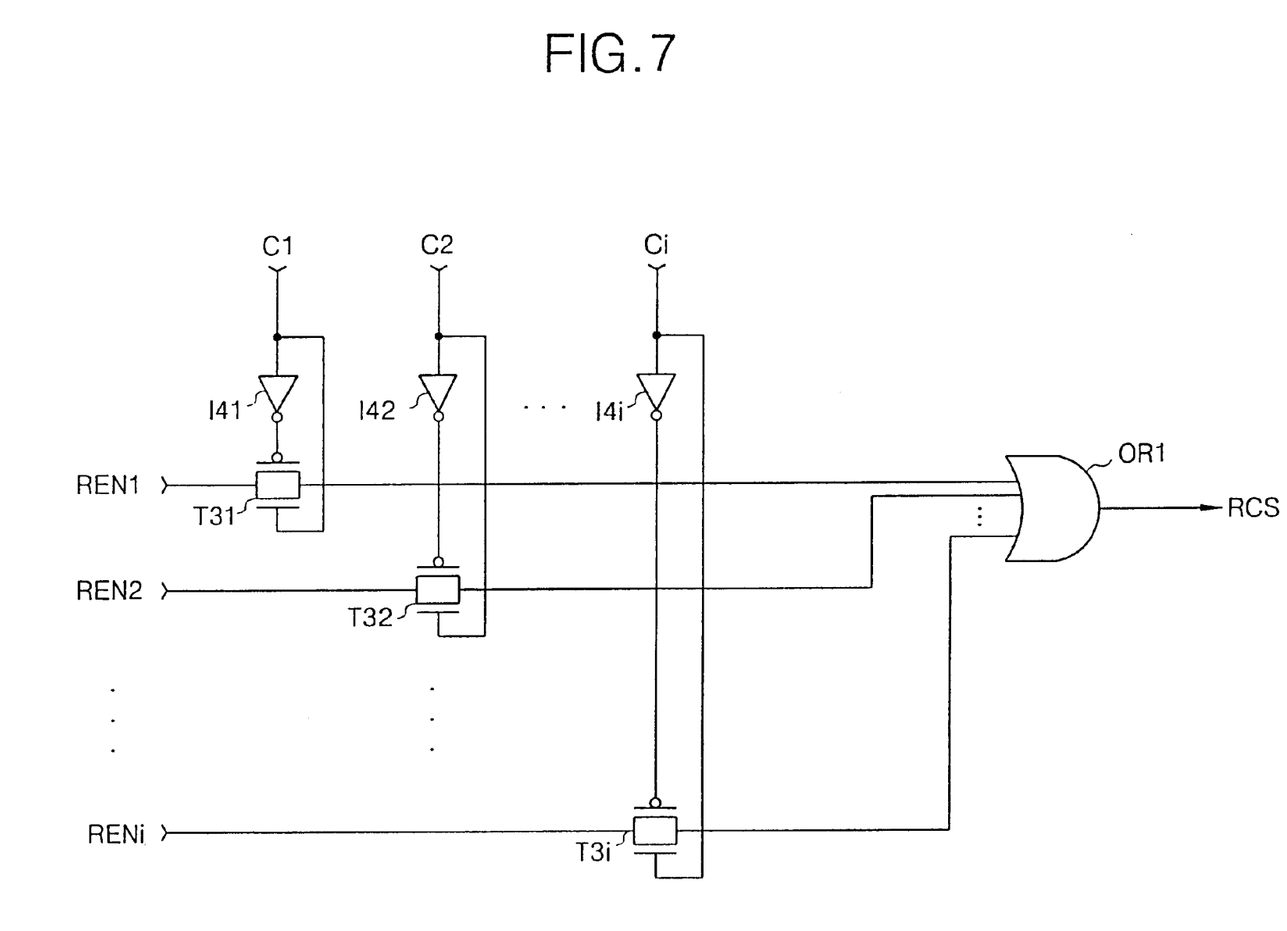
FIG. 7 is a circuit diagram of a selection circuit shown in FIG. 5.

FIG. 7 is a circuit diagram of an embodiment of a selection circuit shown in FIG. 5, and includes inverters 141, 142, . . . and 14i, CMOS transmission gates T31, T32, . . . and T3i, and an OR gate OR1. The operation of a circuit shown in FIG. 7 will be described as follows. A CMOS transmission gate T31 is turned on in response to a "high" level block control signal C1 and transmits a redundant enable signal REN1. Each of CMOS transmission gates T32, . . . and T3i is turned on in response to each of "high" level block control signals C2, . . . and Ci and transmits redundant enable signals REN2, . . . and RENi respectively. An OR gate OR1 generates a "high" level signal RCS for selecting redundant column select signal line RCSL in case that more than one signal among signals transmitted through CMOS transmission gates T31, T32, . . . and T3i are at "high" level. That is, redundant enable signals REN2, . . . and RENi are set as "high" level or "low" level in advance by programming fuses, and if corresponding block control signals C1, C2, . . . and Ci are generated, a corresponding redundant enable signal is output to a redundant column select signal RCS.

Figure 8:
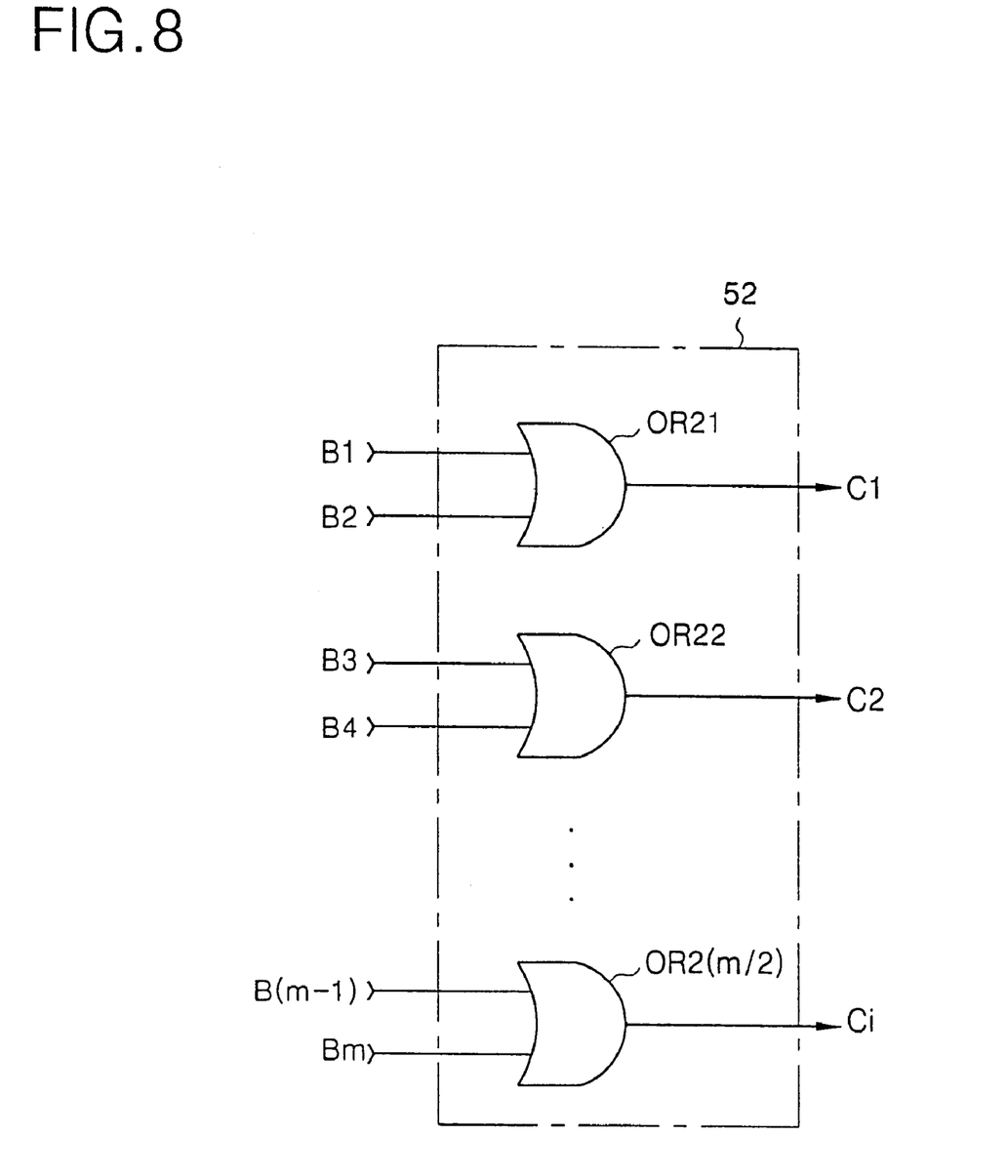
FIG. 8 is a circuit diagram of a control signal generating circuit of FIG. 5.

FIG. 8 is a circuit diagram of a control signal generating circuit 52 of FIG. 5, and includes OR gates OR21, OR22, . . . and OR2(m/2). The operation of a circuit shown in FIG. 8 will be described as follows. Block select signals B1, B2, B3, B4, . . . , B(m−1) and Bm for selecting m memory cell array blocks BL1, BL2, BL3, . . . and BLm are generated by decoding a row address(not shown). The control signal generating circuit 52 generates i block control signals C1, C2, . . . and Ci by ORing each two of block select signals B1, B2; B3, B4; . . . and B(m−1), Bm by OR gates OR21, OR22, . . . and OR2(m/2). That is, in this case, the redundancy operation is performed in units of every two memory cell array blocks of m memory cell array blocks.

In the above embodiment, the control signal generating circuit is configured to generate block control signals by grouping every two memory cell array blocks. However, as an alternative, the control signal generating circuit may be configured to generate block control signals by grouping every three memory cell array blocks. Also, the control signal generating circuit of the present invention can be configured to generate block control signals by being programmed by a user, by grouping block select signals for selecting memory cell array blocks connected to the same defective column select signal line. In this alternative embodiment, the control signal generating circuit will not have a fixed circuit configuration as described above with respect to FIG. 8. That is, the control signal generating circuit can enable the programming of group memory cell array blocks according to test results.

Figure 9:
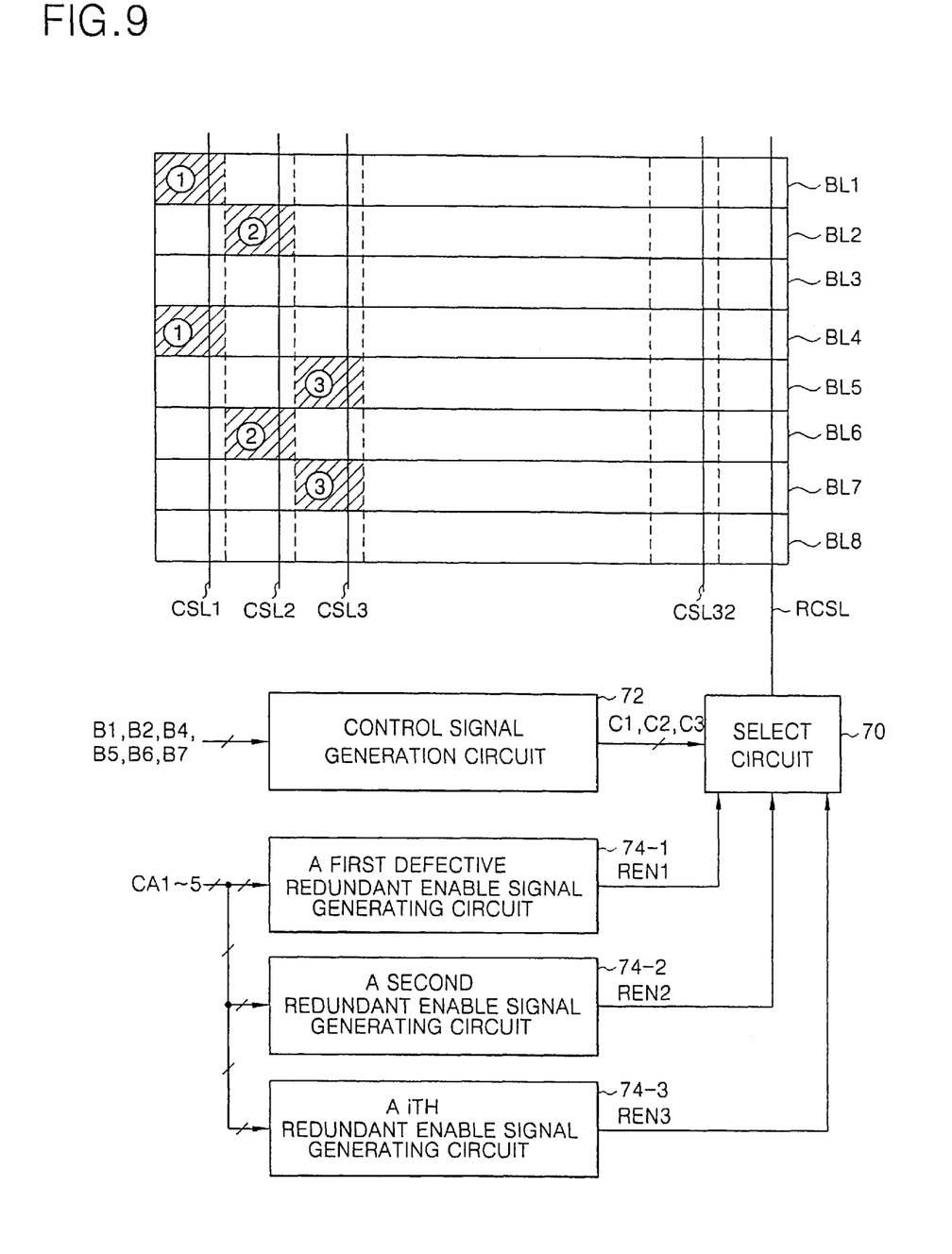
FIG. 9 is a block diagram of a redundant circuit of a semiconductor memory device of an embodiment of the present invention.

FIG. 9 is a block diagram of an embodiment of a redundancy circuit of a semiconductor memory device of the present invention, which shows a redundancy circuit in a case whereby oblique-lined partial blocks of eight memory cell array blocks BL1, BL2, BL3, BL4, BL5, BL6, BL7 and BL8 are defective.

A control signal generating circuit 72 generates three block control signals C1, C2 and C3 responsive to six block select signals B1, B2, B4, B5, B6 and B7. In the embodiment of FIG. 9, since a column select signal line CSL1 connected to oblique-lined partial blocks ① of memory cell array blocks BL1 and BL4, a column select signal line CSL2 connected to oblique-lined partial blocks ② of memory cell array blocks BL2 and BL6, and a column select signal line CSL3 connected to oblique-lined partial blocks ③ of memory cell array blocks BL5 and BL7 are defective, the control signal generating circuit 72 generates three block control signals C1, C2 and C3 by combining six block select signals B1, B2, B4, B5, B6 and B7.

A first defective redundant enable signal generating circuit 74-1 generates a "high" level redundant enable signal REN1 in the event that a column address 00000000 as to blocks BL1 and BL4 is applied. A second defective redundant enable signal generating circuit 74-2 generates a "high" level redundant enable signal REN2 in the event that a column address 00000001 as to blocks BL2 and BL6 is applied. A third defective redundant enable signal generating circuit 74-3 generates a "high" level redundant enable signal REN3 in the event that a column address 00000010 as to blocks BL5 and BL7 is applied. A selection circuit 70 generates a redundant column select signal RCS for redundant enable signals REN1, REN2 and REN3, responsive to block control signals C1, C2 and C3.

Figure 10:
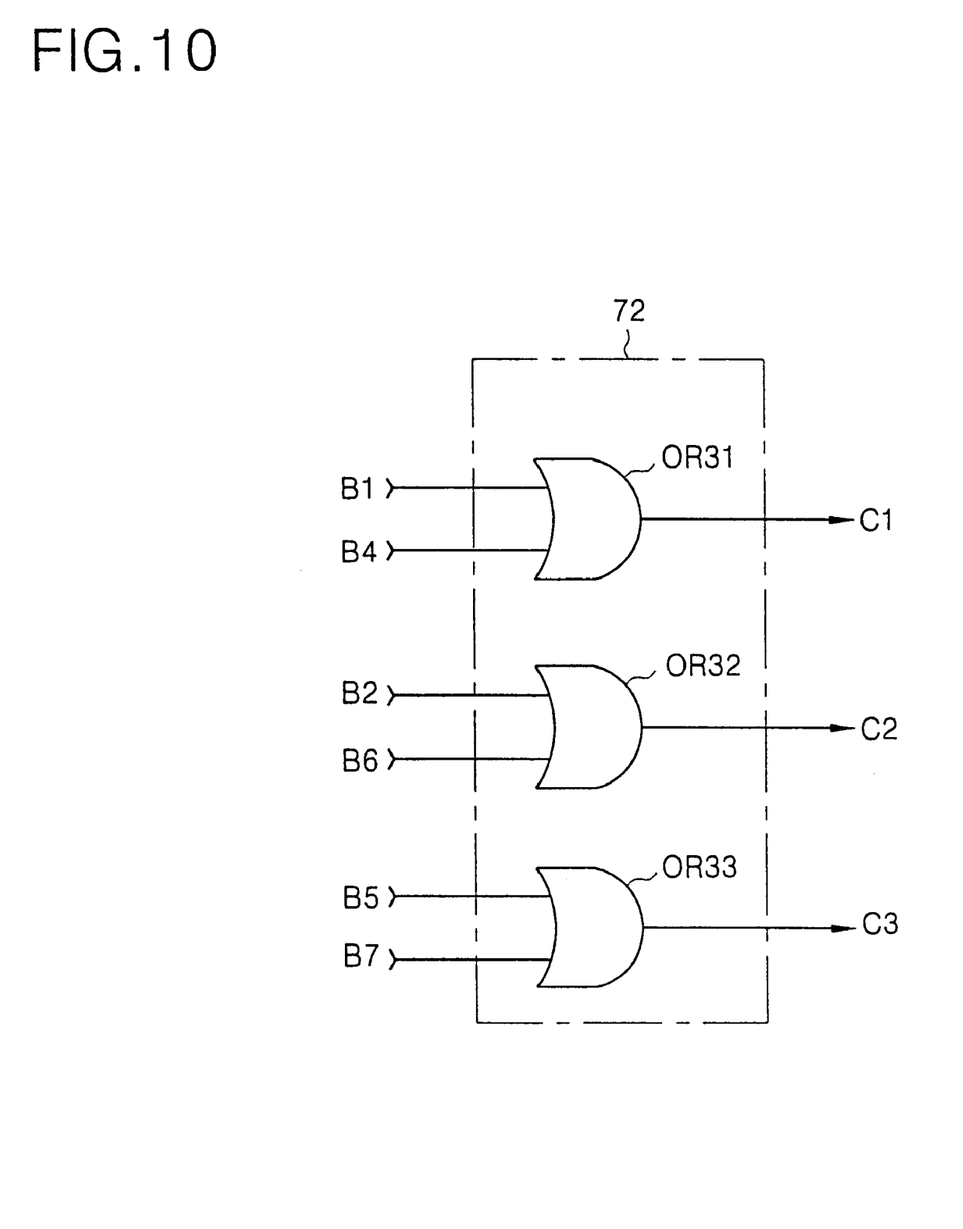
FIG. 10 is a circuit diagram of a control signal generating circuit of FIG. 9.

FIG. 10 is a circuit diagram of an embodiment of the control signal generating circuit 72 configured or programmed specifically for the defective partial blocks illustrated and described with respect to FIG. 9. The control signal generating circuit in this particular instance includes OR gates OR31, OR32 and OR33. The operation of a circuit shown in FIG. 10 will be described as follows. An OR gate OR31 generates a block control signal C1 by ORing block select signals B1 and B4, an OR gate OR32 generates a block control signal C2 by Oring block select signals B2 and B6, and an OR gate OR33 generates a block control signal C3 by ORing block select signals B5 and B7.

As should be understood from the above description, the semiconductor memory device and redundancy method of the present invention increases redundancy efficiency by dividing the plurality of memory cell array blocks into a predetermined number of groups and replacing defective column select signal lines in the corresponding groups with a redundant column select signal line, not by merely replacing the defective column select signal line of the plurality of memory cell array blocks with a redundant column select signal line one at a time.

The semiconductor memory device and redundancy method thereof of the present invention increases redundancy efficiency by performing a redundancy operation wherein the plurality of memory cell array blocks are divided into a predetermined number of groups according to the specific defects, or in other words according to which partial blocks of the memory cell array blocks are defective. Therefore, the yield of the semiconductor memory device is improved, because defects that cannot be repaired in the conventional semiconductor memory device can be repaired in accordance with the features of the present invention.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:
1. A semiconductor memory device comprising:
   a plurality of memory cell array blocks respectively including a plurality of partial blocks and a predetermined number of redundant partial blocks,
   said plurality of memory cell array blocks also including a plurality of column select signal lines connected to the plurality of partial blocks and a predetermined number of redundant column select signal lines connected to the predetermined number of redundant partial blocks;
   control signal generators, respectively included for each of the predetermined number of redundant column select signal lines, that generate a predetermined number of block control signals by dividing the plurality of memory cell array blocks into a predetermined number of groups;
   a predetermined number of defective redundant enable signal generators included for each of the predetermined number of redundant column select signal lines, that generate a predetermined number of redundant enable signals when defective addresses corresponding to each of the predetermined number of block control signals are input; and
   selectors, respectively included for each of the predetermined number of redundant column select signal lines, that generate each of the predetermined number of redundant enable signals as a select signal that selects the corresponding redundant column select signal line in response to each of the predetermined number of block control signals.

2. The semiconductor memory device according to claim 1, wherein said control signal generators generate the predetermined number of block control signals by assembling block select signals that activate each of said plurality of memory cell array blocks, in units of a predetermined number.

3. The semiconductor memory device according to claim 1, wherein said selectors comprise a predetermined number of first CMOS transmission gates that transmit each of the predetermined number of redundant enable signals, respectively in response to the predetermined number of block control signals.

4. The semiconductor memory device according to claim 1, wherein said predetermined number of defective redundant enable signal generators each comprise:
   a redundant control signal generator that generates a redundant control signal;
   a plurality of defective address setters that set a defective address of plural bits by responding to the redundant control signal and an input column address of plural bits; and
   an enable signal generator that generates a redundant enable signal by assembling output signals of said plurality of defective address setters.

5. The semiconductor memory device according to claim 4, wherein said redundant control signal generator comprises:
   a first fuse connected between a power source voltage and a first node;
   a first NMOS transistor which is connected between the first node and a ground voltage, and that responds to a control signal;
   a first inverter that inverts an output signal provided from the first node;
   a second NMOS transistor which is connected parallel to said first NMOS transistor, and that responds to an output signal of said first inverter;
   a second inverter that generates a first signal by inverting the output signal of said first inverter; and
   a third inverter that generates a second signal by inverting the first signal.

6. The semiconductor memory device according to claim 5, wherein each of said plurality of defective address setters comprises:
   first and second CMOS transmission gates that transmit a column address in response to each of the first and second signals;
   second and third fuses which are connected respectively to said first and second CMOS transmission gates and that are connected commonly to an output port; and
   a third NMOS transistor that resets the output port in response to the first signal.

7. A redundancy circuit of a semiconductor memory device that has a plurality of memory cell array blocks respectively including a plurality of partial blocks and at least more than one redundant partial blocks, comprising:
   control signal generators, respectively included for each of the at least more than one redundant partial blocks, that generate a predetermined number of block control signals by dividing the plurality of memory cell array blocks into a predetermined number of groups;
   a predetermined number of defective redundant enable signal generators included for each of the at least more than one redundant partial blocks, that generate a predetermined number of redundant enable signals when defective addresses corresponding to each of the predetermined number of block control signals are input; and
   selectors, respectively included for each of the at least more than one redundant partial blocks, that generate each of the predetermined number of redundant enable signals into a select signal that selects the corresponding redundant partial block in response to each of the predetermined number of block control signals.

8. The redundancy circuit of a semiconductor memory device according to claim 7, wherein said control signal generators generate the predetermined number of block control signals by assembling a plurality of block select signals that activate each of the plurality of memory cell array blocks, in units of a predetermined number.

9. The redundancy circuit of a semiconductor memory device according to claim 7, wherein said selectors comprise a predetermined number of first CMOS transmission gates that transmit each of the predetermined number of redundant enable signals, respectively in response to the predetermined number of block control signals.

10. The redundancy circuit of a semiconductor memory device according to claim 7, wherein each of said predetermined number of defective redundant enable signal generators comprises:
    a redundant control signal generator that generates a redundant control signal;
    a plurality of defective address setters that set a defective address of plural bits by responding to the redundant control signal and an input column address of plural bits; and
    an enable signal generator that generates a redundant enable signal by assembling output signals of said plurality of defective address setters.

11. The redundancy circuit of a semiconductor memory device according to claim 10, wherein said redundant control signal generator comprises:
    a first fuse connected between a power source voltage and a first node;
    a first NMOS transistor which is connected between the first node and a ground voltage, and that responds to a control signal;
    a first inverter that inverts an output signal provided from the first node;
    a second NMOS transistor which is connected parallel to said first NMOS transistor, and that responds to an output signal of said first inverter;
    a second inverter that generates a first signal by inverting the output signal of said first inverter; and
    a third inverter that generates a second signal by inverting the first signal.

12. The redundancy circuit of a semiconductor memory device according to claim 11, wherein each of said plurality of defective address setters comprises:
    first and second CMOS transmission gates that transmit a column address in response to each of the first and second signals;
    second and third fuses which are connected respectively to said second and third CMOS transmission gates and that are connected commonly to an output port; and
    a third NMOS transistor that resets the output port in response to the first signal.

13. A redundancy method of a semiconductor memory device which includes a plurality of partial blocks and at least more than one redundant partial blocks respectively as a plurality of memory cell array blocks, a plurality of column select signal lines connected to the plurality of partial blocks, and at least more than one redundant column select signal lines connected to the at least more than one redundant partial blocks, comprising:
    generating a predetermined number of block control signals for each of the at least more than one redundant column select signal lines by dividing the plurality of memory cell array blocks into a predetermined number of groups;

generating a predetermined number of redundant enable signals for each of the at least more than one redundant column select signal lines, when defective addresses corresponding to each of the predetermined number of block control signals are input; and generating each of the predetermined number of redundant enable signals into a select signal that selects a corresponding redundant column select signal line in response to each of the predetermined number of block control signals, for each of the at least more than one redundant column select signal lines.

* * * * *